United States Patent
Subbaiyan et al.

(10) Patent No.: US 11,158,519 B2
(45) Date of Patent: Oct. 26, 2021

(54) METHOD OF FORMING CAPPED METALLIZED VIAS

(71) Applicant: Corning Incorporated, Corning, NY (US)

(72) Inventors: Navaneetha Krishnan Subbaiyan, Portland, OR (US); William Richard Trutna, Atherton, CA (US)

(73) Assignee: Corning Incorporated, Corning, NY (US)

(*) Notice: Subject to any disclaimer, the term of this patent is extended or adjusted under 35 U.S.C. 154(b) by 171 days.

(21) Appl. No.: 16/681,330

(22) Filed: Nov. 12, 2019

(65) Prior Publication Data

US 2020/0185272 A1   Jun. 11, 2020

Related U.S. Application Data

(60) Provisional application No. 62/776,101, filed on Dec. 6, 2018.

(51) Int. Cl.
| | |
|---|---|
| *H01L 21/48* | (2006.01) |
| *H01L 21/768* | (2006.01) |
| *H01L 23/498* | (2006.01) |
| *H01L 23/15* | (2006.01) |
| *H01L 23/14* | (2006.01) |

(52) U.S. Cl.
CPC ...... *H01L 21/486* (2013.01); *H01L 21/76898* (2013.01); *H01L 23/15* (2013.01); *H01L 23/49827* (2013.01); *H01L 23/49866* (2013.01); *H01L 23/147* (2013.01)

(58) Field of Classification Search
CPC .................. H01L 21/786; H01L 21/76898
See application file for complete search history.

(56) References Cited

U.S. PATENT DOCUMENTS

| | | | |
|---|---|---|---|
| 6,452,117 B2 | 9/2002 | Curcio et al. | |
| 6,566,250 B1 * | 5/2003 | Tu ................. | H01L 21/288 257/E21.174 |
| 7,204,102 B1 | 4/2007 | Eames et al. | |
| 9,236,274 B1 | 1/2016 | Mobley et al. | |
| 9,631,267 B2 | 4/2017 | Chen | |
| 9,761,516 B1 | 9/2017 | Knickerbocker et al. | |
| 2010/0301485 A1 | 12/2010 | Sekine et al. | |
| 2012/0161326 A1 | 6/2012 | Choi et al. | |

(Continued)

FOREIGN PATENT DOCUMENTS

WO    2019018604 A1    1/2019

OTHER PUBLICATIONS

International Search Report and Written Opinion of the European International Searching Authority; PCT/US2019/062935; dated Apr. 9, 2020; 10 Pgs.

(Continued)

*Primary Examiner* — Daniel Luke
(74) *Attorney, Agent, or Firm* — Kevin L. Bray

(57) ABSTRACT

A method of forming an article, including: inserting a conductive material within a via a wafer, wherein the conductive material comprises a first alloy comprising a first metal and a second metal; and contacting the conductive material with a solution comprising ions of a third metal, wherein the ions of the third metal galvanically displace a portion of the second metal from the first alloy to form a second alloy with the first metal.

20 Claims, 5 Drawing Sheets

(56) References Cited

U.S. PATENT DOCUMENTS

2012/0235969 A1  9/2012  Burns et al.
2020/0258827 A1* 8/2020  Aleksov ............ H01L 23/49811

OTHER PUBLICATIONS

Ohara et al; "A Cost Effective via Last TSV Technology Using Molten Solder Filling for Automobile Application"; 2017 IEEE 67th Electronic Components and Technology Conference (ECTC), May 30-June 2, 2017; 2017; pp. 47-52.
Horibe et al; "Solder Injected Through via for Multi Stacked Wafers", 2016 IEEE 66th Electronic Components and Technology Conference (ECTC), May 31-June 3, 2016; 2016; pp. 2176-2181.

* cited by examiner

METHOD OF FORMING CAPPED METALLIZED VIAS

This application claims the benefit of priority to U.S. Provisional Application Ser. No. 62/776,101 filed on Dec. 6, 2018, the content of which is relied upon and incorporated herein by reference in its entirety.

FIELD OF THE DISCLOSURE

The present disclosure relates to vias in articles, and more specifically, to metallized vias through articles including caps.

BACKGROUND

Through hole connections enable thin silicon via (TSV) and thin glass via (TGV) based technologies that provide high packaging density, reduced signal path, wide signal bandwidth, lower packaging cost and miniaturized systems. Conventional processes available for filling vias with copper include paste-fill processes and electroplating processes.

Various efforts have been made to fill the vias with copper to ensure hermeticity for packaging and switch related applications. In addition to presenting challenges in the formation of copper vias, a copper filled TGV has a coefficient of thermal expansion (CTE) mismatch between copper and glass resulting in poor reliability. Further, the adhesion of copper to silicon and glass is low which may decrease reliability of the TGV.

SUMMARY OF THE DISCLOSURE

According to at least one feature of the present disclosure, a method of forming an article, including: inserting a conductive material within a via a wafer, wherein the conductive material comprises a first alloy comprising a first metal and a second metal; and contacting the conductive material with a solution comprising ions of a third metal, wherein the ions of the third metal galvanically displace a portion of the second metal from the first alloy to form a second alloy with the first metal.

According to another feature of the present disclosure, a method of forming an article, including: inserting an electrically conductive material within a via of a wafer, wherein the electrically conductive material comprises a first alloy comprising a first metal and a second metal; applying a solution comprising ions of a third metal to the conductive material; and galvanically exchanging a portion of the first alloy with a portion of the ions of the third metal to form a cap layer comprising a second alloy in contact with the conductive material, wherein the standard reduction potential of the third metal is at least 0.15 V greater than the standard reduction potential of the second metal.

According to another feature of the present disclosure, a method of forming an article, including: forming a via extending from a surface of a glass wafer into a body of the glass wafer; inserting an electrically conductive material comprising In and a second metal within the via; applying a solution comprising ions of a third metal to the surface of the wafer and the electrically conductive material; and galvanically exchanging a portion of the ions of the third metal with a portion of the electrically conductive material to form a cap layer in contact with the electrically conductive material which seals the via proximate the surface of the wafer, wherein a cell potential of the exchange between a portion of the electrically conductive material and the third metal is about 0.3 V or greater.

These and other features, advantages, and objects of the present disclosure will be further understood and appreciated by those skilled in the art by reference to the following specification, claims, and appended drawings.

BRIEF DESCRIPTION OF THE DRAWINGS

The following is a description of the figures in the accompanying drawings. The figures are not necessarily to scale, and certain features and certain views of the figures may be shown exaggerated in scale or in schematic in the interest of clarity and conciseness.

In the drawings.

DETAILED DESCRIPTION

Figure 1:
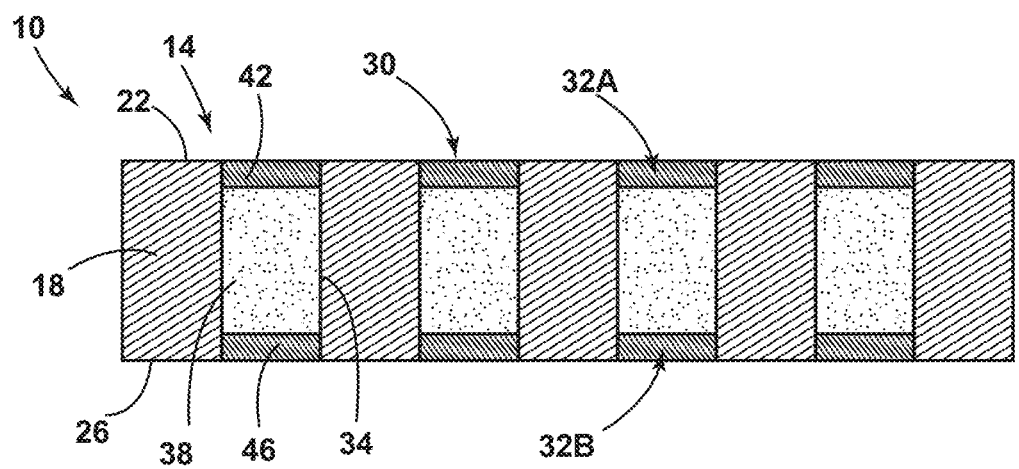
FIG. 1 is a cross-sectional view of an article, according to at least one example.

Additional features and advantages of the invention will be set forth in the detailed description which follows and will be apparent to those skilled in the art from the description, or recognized by practicing the invention as described in the following description, together with the claims and appended drawings.

As used herein, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination.

In this document, relational terms, such as first and second, top and bottom, and the like, are used solely to distinguish one entity or action from another entity or action, without necessarily requiring or implying any actual such relationship or order between such entities or actions.

It will be understood by one having ordinary skill in the art that construction of the described disclosure, and other components, is not limited to any specific material. Other exemplary embodiments of the disclosure disclosed herein may be formed from a wide variety of materials, unless described otherwise herein.

For purposes of this disclosure, the term "coupled" (in all of its forms: couple, coupling, coupled, etc.) generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature, or may be removable or releasable in nature, unless otherwise stated.

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. When the term "about" is used in describing a value or an end-point of a range, the disclosure should be understood to include the specific value or end-point referred to. Whether or not a numerical value or end-point of a range in the specification recites "about," the numerical value or end-point of a range is intended to include two embodiments: one modified by "about," and one not modified by "about." It will be further understood that the end-points of each of the ranges are significant both in relation to the other end-point, and independently of the other end-point.

The terms "substantial," "substantially," and variations thereof as used herein are intended to note that a described feature is equal or approximately equal to a value or description. For example, a "substantially planar" surface is intended to denote a surface that is planar or approximately planar. Moreover, "substantially" is intended to denote that two values are equal or approximately equal. In some embodiments, "substantially" may denote values within about 10% of each other.

Referring now to FIG. 1, depicted is an article 10 including a wafer 14 having a body 18 which defines a first surface 22 and a second surface 26. The wafer 14 defines a via 30 having a via surface 34 extending between the first and second surfaces 22, 26 through the body 18. The wafer 14 defines a first entrance 32A at the first surface 22 and a second entrance 32B at the second surface 26. A conductive material 38 is positioned within the via 30 and is composed of a first alloy. The via 30 may be capped by a first cap layer 42 positioned on top of the conductive material 38 proximate the first surface 22 and by a second cap layer 46 positioned below the conductive material 38 and proximate the second surface 26. The first and second cap layers 42, 46 may be formed of a second alloy.

The wafer 14 has the body 18 which defines the first and second surfaces 22, 26. It will be understood that the wafer 14 and/or body 18 may further define one or more minor surfaces positioned along edges thereof. The wafer 14 may be a substantially planar sheet, although other examples of the article 10 may utilize a curved or otherwise shaped or sculpted wafer 14. Further, the wafer 14 may vary in thickness, width and/or length across the wafer 14 without departing from the teachings provided herein.

According to various examples, the wafer 14 may be composed of an electrically insulating material. For example, the wafer 14 may be composed of a glass material, a glass-ceramic material, a ceramic material, silicon-based semiconductor material, silicon, a polymeric material and/or combinations thereof. Glass-based examples of the wafer 14 may include soda lime glass, float glass, fluoride glass, aluminosilicate glass, phosphate glass, borate glass, borosilicate glass, chalcogenide glass, aluminum oxide, silicon having an oxidized surface, alkali aluminosilicate glass, alkali containing borosilicate glass, alkali aluminoborosilicate glass and/or combinations thereof. In glass examples of the wafer 14, the wafer 14 may be strengthened or strong. For instance, glass examples of the wafer 14 may be thermally tempered (e.g., for strong wafers 14) or have an ion-exchanged region (e.g., for strengthened wafers 14). Further, the wafer 14 may include a sapphire material. In ceramic examples of the wafer 14, the wafer 14 may be at least partially composed of alumina, beryllia, ceria, zirconia oxides, barium-based ceramics (e.g., $BaTiO_3$) and/or combinations thereof. Further, ceramic examples of the wafer 14 may include non-oxide ceramics such as carbides, borides, nitrides and silicides. In polymeric examples of the wafer 14, the wafer 14 may be at least partially composed of thermoplastics including polystyrene (PS) (including styrene copolymers and blends), polycarbonate (PC) (including copolymers and blends), polyesters (including copolymers and blends, including polyethyleneterephthalate and polyethyleneterephthalate copolymers), polyolefins (PO) and cyclicpolyolefins (cyclic-PO), polyvinylchloride (PVC), acrylic polymers including polymethyl methacrylate (PMMA) (including copolymers and blends), thermoplastic urethanes (TPU), polyetherimide (PEI) and blends of these polymers with each other. Other exemplary polymers include epoxy, styrenic resins, phenolic resins, melamine resins, silicone resins and/or combinations thereof.

The wafer 14 may be substantially translucent, clear, transparent and/or free from light scattering. For example, the wafer 14 may be optically transparent to light having a wavelength in the range of between about 100 nanometers and about 1,200 nanometers, or in a range of about 250 nanometers to about 1,100 nanometers. In some examples, the transmission of light through the wafer 14 may be dependent on the wavelength of the light. For example, the wafer 14 may be optically opaque or translucent over a visible wavelength band (e.g., from about 400 nm wavelength to about 700 nm wavelength) while substantially or fully transmissive at non-visible wavelengths or vice versa.

According to various examples, the wafer 14 can have a thickness (i.e., as measured from the first surface 22 to the second surface 26) ranging from about 50 µm to about 5 mm. Exemplary thicknesses of the wafer 14 range from about 1 µm to about 1000 µm, or from about 100 µm to about 1000 µm or from about 100 µm to about 500 µm. For example, the wafer 14 may have a thickness of about 1 µm, about 5 µm, about 10 µm, about 20 µm, about 30 µm, about 40 µm, about 50 µm, about 60 µm, about 70 µm, about 80 µm, about 90 µm, about 100 µm, about 200 µm, about 300 µm, about 400 µm, about 500 µm, about 600 µm, about 700 µm, about 800 µm, about 900 µm, about 1000 µm, about 2000 µm, about 3000 µm, about 4000 µm or about 5000 µm or any and all values and ranges therebetween. Additionally or alternatively, the thickness of the wafer 14 may vary along one or more of its dimensions for aesthetic and/or functional reasons. For example, the edges of the wafer 14 may be thicker as compared to more central regions of the wafer 14, or vice versa. The length, width and thickness dimensions of the wafer 14 may also vary according to the application or use of the article 10.

The body 18 of the wafer 14 defines or includes the vias 30. The wafer 14 may define a single via 30 or may define a plurality of vias 30. The vias 30 may be defined at predetermined locations around the wafer 14 and/or may be positioned randomly. For example, the vias 30 may form a pattern, indicia and/or text. According to various examples, the pattern of the vias 30 may correspond to an electrical circuit or chip. The vias 30 and/or the body 18 define the via surfaces 34 which extend around the vias 30. The vias 30 may have an irregular, circular, oval, triangular, square, rectangular, or higher order polygon cross-sectional shape. It will be understood that the vias 30 may have different cross-sectional shapes than one another without departing from the teachings provided herein. As the vias 30 extend through the body 18 of the wafer 14, the vias 30 may have the same length as the thickness of the body 18. In other words, the vias 30 may have a length of about 1 μm, about 5 μm, about 10 μm, about 20 μm, about 30 μm, about 40 μm, about 50 μm, about 60 μm, about 70 μm, about 80 μm, about 90 μm, about 100 μm, about 200 μm, about 300 μm, about 400 μm, about 500 μm, about 600 μm, about 700 μm, about 800 μm, about 900 μm, about 1000 μm, about 2000 μm, about 3000 μm, about 4000 μm or about 5000 μm. It will be understood that in examples where the thickness of the wafer 14 changes with position, the vias 30 may also change in length such that different vias 30 have different lengths. It will be understood that the length of the vias 30 are measured along a centerline axis of the via 30 such that the length is the axial length of the via 30.

The diameter, or longest length dimension in a cross-sectional plane, of the vias 30 may be from about 1 μm to about 300 μm, or from about 5 μm to about 200 μm, or from about 10 μm to about 100 μm. For example, the vias 30 may have a diameter of about 10 μm, about 20 μm, about 30 μm, about 40 μm, about 50 μm, about 60 μm, about 70 μm, about 80 μm, about 90 μm or about 99 μm. It will be understood that the diameter of the via 30 may vary across the length of the via 30. In other words, one or more of the vias 30 may be tapered. It will be understood that the vias 30 may have different diameters or different degrees of tapering than one another.

The vias 30 may have an aspect ratio (e.g., expressed as the proportional relationship between the length of the via 30 to the width of the via 30) of from about 1:1 to about 30:1, or from about 2:1 to about 20:1, or from about 3:1 to about 15:1. For example, the vias 30 may have an aspect ratio of about 1:1 or greater, about 2:1 or greater, about 3:1 or greater, about 4:1 or greater, about 5:1 or greater, about 6:1 or greater, about 7:1 or greater, about 8:1 or greater, about 9:1 or greater, about 10:1 or greater, about 11:1 or greater, about 12:1 or greater, about 13:1 or greater, about 14:1 or greater, about 15:1 or greater, about 16:1 or greater, about 17:1 or greater, about 18:1 or greater, about 19:1 or greater, about 20:1 or greater and any and all values therebetween. It will be understood that the aspect ratio of the vias 30 may be different from one another or the aspect ratio of the vias 30 may be the same.

According to various examples, one or more of the vias 30 may be formed at an angle between the first and second surfaces 22, 26. In other words, a centerline axis of the vias 30 may not be orthogonal to the first and second surfaces 22, 26. In such examples, a centerline axis of the vias 30 may be at an angle of from about 0° to about 40° from an orthogonal axis of the first and second surfaces 22, 26. It will be understood that the angle of the vias 30 may be different from one another or may be the same.

The vias 30 may take a variety of cross-sectional shapes. For example, one or more of the vias 30 may be tapered from one end to another (e.g., a diameter of the vias 30 proximate the first surface 22 may be greater than the diameter of the via 30 proximate the second surface 26), hourglass-shaped (i.e., the via 30 may be tapered towards a minimum diameter located within the body 18 of the wafer 14), other shapes and/or combinations thereof.

As explained above, the conductive material 38 is positioned within the via 30 of the wafer 14. According to various examples, the conductive material 38 is in direct contact with the via surface 34 of the via 30. As used herein, the term "direct contact" means that the via surface 34 and the conductive material 38 are in contact with one another without intervening layers disposed therebetween. The conductive material 38 may be in contact with a portion, a majority, substantially all or all of the via surface 34. For example, the conductive material 38 may be in contact with about 5%, or about 10%, or about 15%, or about 20%, or about 25%, or about 30%, or about 35%, or about 40%, or about 45%, or about 50%, or about 55%, or about 60%, or about 65%, or about 70%, or about 75%, or about 80%, or about 85%, or about 90%, or about 95%, or about 96%, or about 97%, or about 98%, or about 99% of the via surface 34. It will be understood that any and all values and ranges between the given values are contemplated.

The conductive material 38 may extend a portion, a majority, substantially all or all of an axial length of the via 30. In other words, the conductive material 38 may extend a distance between the first and second surfaces 22, 26 with the first and/or second cap layers 42, 46 filling the remaining distance. For example, the conductive material 38 may extend about 5%, or about 10%, or about 15%, or about 20%, or about 25%, or about 30%, or about 35%, or about 40%, or about 45%, or about 50%, or about 55%, or about 60%, or about 65%, or about 70%, or about 75%, or about 80%, or about 85%, or about 90%, or about 95%, or about 96%, or about 97%, or about 98%, or about 99% of the axial length of the axial length of the via 30. It will be understood that any and all values and ranges between the given values are contemplated.

The conductive material 38 may fill a portion, a majority, substantially all or all of a volume of the via 30. In other words, the conductive material 38 may fill a first volume of the via 30 with the first and/or second cap layers 42, 46 filling the remaining volume of the via 30. For example, the conductive material 38 may fill about 5%, or about 10%, or about 15%, or about 20%, or about 25%, or about 30%, or about 35%, or about 40%, or about 45%, or about 50%, or about 55%, or about 60%, or about 65%, or about 70%, or about 75%, or about 80%, or about 85%, or about 90%, or about 95%, or about 96%, or about 97%, or about 98%, or about 99% of the volume of the via 30. It will be understood that any and all values and ranges between the given values are contemplated.

The conductive material 38 is composed of a first alloy. According to various examples, the conductive material may be electrically conductive and/or thermally conductive. The first alloy may include a first metal and a second metal. The first alloy of the conductive material may be include In, Zn, Hf, Zr, Sn, Bi, Ag, Fe, Cr, Pb, Sb, Ti, Si, Cu, rare earth elements (e.g., Ce, La, and Lu) other elements and/or combinations thereof. The first alloy may include any one of In, Zn, Hf, Zr, W, Sn, Bi, Ag, Fe, Cr, Pb, Sb, Ti, Si and/or Cu in an amount of about 10 mol % or greater, or about 15 mol % or greater, or about 20 mol % or greater, or about 25 mol % or greater, or about 30 mol % or greater, or about 35 mol % or greater, or about 40 mol % or greater, or about 45 mol % or greater, or about 50 mol % or greater, or about 55 mol % or greater, or about 60 mol % or greater, or about 65 mol % or greater, or about 70 mol % or greater, or about 75 mol % or greater, or about 80 mol % or greater, or about 85 mol % or greater, or about 90 mol % or greater, or about 95 mol % or greater or any and all values and ranges between the given values. Further, the first alloy may include any one of In, Zn, Hf, Zr, Sn, Bi, Ag, Fe, Cr, Pb, Sb, Ti, Si and/or Cu in an amount of about 50 mol % or less, or about 45 mol % or less, or about 40 mol % or less, or about 35 mol % or less, or about 30 mol % or less, or about 25 mol % or less, or about 20 mol % or less, or about 15 mol % or less, or about 10 mol % or less, or about 9 mol % or less, or about 8 mol % or less, or about 7 mol % or less, or about 6 mol % or less, or about 5 mol % or less, or about 4 mol % or less, or about 3 mol % or less, or about 2 mol % or less, or about 1 mol % or less or any and all values and ranges therebetween. The first metal of the first alloy may include at least one of In and W while the second metal of the first alloy may include at least one of Zn, Sn, Bi, Pb, Fe and Mn.

It will be understood that the conductive material 38 in one or more vias 30 may have different compositions without departing from the teachings provided herein. For example, a first subset of the vias 30 filled with the conductive material 38 may have a different composition than a second subset of vias 30 filled with the conductive material 38. Further, the composition of one or more of the vias 30 filled with the conductive material 38 may change across the length of the via 30. For example, one or more vias 30 filled with the conductive material 38 may have a first composition proximate the first surface 22 and a second composition, which is different than the first composition, proximate the second surface 26.

According to various examples, the first alloy of the conductive material 38 may include In and/or W. Use of In and/or W in the conductive material 38 may be advantageous in that the In and W bind strongly with the material (e.g., glass) of the wafer 14. In other words, the first metal is chemically bonded (e.g., covalently) to the wafer 14. Further, as will be explained in greater detail below, sonication of the wafer 14 during the formation/placement/insertion of the conductive material 38 may produce OH molecules on the via surface 34 which react with constituents of the conductive material 38 thereby forming a tighter bond with the wafer 14. Such a feature may be advantageous in facilitating the removal of conventional adhesion and/or barrier layers on the via surface 34. In other words, the conductive material 38 may be in direct contact with the via surface 34 without intervening adhesion and/or barrier layers.

The conductive material 38, the first cap layer 42 and the second cap layer 46 may each have a melting temperature. The melting temperature for the conductive material 38 is referred to herein as the material melting temperature and the melting temperature for the first and/or second cap layers 42, 46 is referred to herein as the cap melting temperature. It will be understood that the material melting temperature is also the melting temperature of the first alloy. As used herein, the term "melting temperature" refers to the point at which a portion or all of a composition of material begins to transition from a solid state to a liquid state and encompasses both the temperature at which a pure material transitions to a liquid as well as the temperature at which an alloy, or combination of materials, exhibits some degree of transition from solid to liquid. In alloyed examples, the melting temperature is the solidus temperature at which a portion of the conductive material 38, the first cap layer 42 and/or the second cap layer 46 begins to melt while other portions remain solid. In pure examples, the melting temperature is the temperature at which substantially all of the conductive material 38, the first cap layer 42 and/or the second cap layer 46 will begin to melt.

The material melting temperature of the conductive material 38 may be about 80° C., or about 90° C., or about 100° C., or about 110° C., or about 120° C., or about 130° C., or about 140° C., or about 150° C., or about 160° C., or about 170° C., or about 180° C., or about 190° C., or about 200° C., or about 210° C., or about 220° C., or about 230° C., or about 240° C., or about 250° C., or about 260° C., or about 270° C., or about 280° C., or about 290° C., or about 300° C. or about 310° C., or about 320° C., or about 330° C., or about 340° C., or about 350° C. or any and all values and ranges between the given values. For example, the material melting temperature of the conductive material 38 may be from about 80° C. to about 220° C., or from about 100° C. to about 350° C., or from about 100° C. to about 300° C., or from about 100° C. to about 200° C., or from about 100° C. to about 180° C., or from about 100° C. to about 160° C., or from about 100° C. to about 150° C.

According to various examples, the first cap layer 42 and the second cap layer 46 are configured to seal opposite ends of the via 30. In other words, the first and second cap layers 42, 46 are configured to seal the respective first and second entrances 32A, 32B of the via 30. As used herein, the term "seal" refers to the adhesion of the first and/or second cap layers 42, 46 to the wafer 14 (i.e., the via surface 34, the first surface 22 and/or the second surface 26) with sufficient strength and hermiticity that the conductive material 38, when at or above the material melting temperature, does not freely flow from the via 30. For example, the first cap layer 42 is configured to seal the first entrance 32A of the via 30 proximate the first surface 22 and the second cap layer 46 is configured to seal the second entrance 32B of the via 30 proximate the second surface 26. According to various examples, the first and/or second cap layers 42, 46 are in contact with the conductive material 38. For example, the first and/or second cap layers 42, 46 may be integrally formed with the conductive material 38 or formed directly on the conductive material 38.

The first and/or second cap layers 42, 46 may extend into the via 30 or may be positioned above the via 30. For example, in instances where the conductive material 38 does not completely fill the via 30 (e.g., a top or bottom surface of the conductive material 38 is not flush with the first surface 22 or second surface 26 of the wafer 14), the first and/or second cap layers 42, 46 may extend into the via 30. In such an example, the first and/or second cap layers 42, 46 may be in contact with the via surface 34 such that the via 30 is sealed. The first and/or second cap layers 42, 46 may extend onto the first and/or second surfaces 22, 26 of the wafer 14 and the extent to which the first and/or second cap layers 42, 46 extend into the via 30 is the thickness.

The first and/or second cap layers 42, 46 may have a thickness of about 0.1 µm, or about 0.2 µm, or about 0.3 µm, or about 0.4 µm, or about 0.5 µm, or about 0.6 µm, or about 0.7 µm, or about 0.8 µm, or about 0.9 µm, or about 1.0 µm, or about 2.0 µm, or about 3.0 µm, or about 4.0 µm, or about 5.0 µm, or about 6.0 µm, or about 7.0 µm, or about 8.0 µm, or about 9.0 µm, or about 10 µm, or about 15 µm, or about 20 µm, or about 50 µm or any and all values and ranges between the given values. For example, at least one of the first and second cap layers 42, 46 may have a thickness of from about 0.1 µm to about 20 µm, or from about 0.1 µm to about 10 µm, or from about 0.1 µm to about 9 µm, or from about 0.1 µm to about 8 µm, or from about 0.1 µm to about 7 µm, or from about 0.1 µm to about 6 µm, or from about 0.1

µm to about 5 µm, or from about 0.1 µm to about 4 µm, or from about 0.1 µm to about 3 µm, or from about 0.1 µm to about 2 µm, or from about 0.1 µm to about 1 µm. Further, the first and/or second cap layers 42, 46 may extend in the via 30 from an entrance (e.g., the first or second entrances 32A, 32B) of the via 30 to a depth of about 20 µm or less, or about 10 µm or less, or about 5 µm or less or about 1 µm or less.

As will be explained in greater detail below, the second alloy of the first and/or second cap layers 42, 46 may be formed, a least in part, through the galvanic displacement of ions of a third metal in a solution with the first and second metals of the first alloy of the conductive material 38. As such, the thickness of the first and/or second cap layers 42, 46 is measured as the maximum distance between an outward most point of the first and/or second cap layer 42, 46 and the interface point between the conductive material 38 and the first or second cap layer 42, 46 where the primary constituent (e.g., Cu) of the second alloy of the first and/or second cap layers 42, 46 reaches the same concentration as the concentration of the primary constituent in the first alloy of the conductive material 38.

As explained above, the first and/or second cap layers 42, 46 may be formed of a second alloy. For example, the second alloy of the first and/or second cap layers 42, 46 may include at least one of Cu, Ag, Au, Co, Pt, Ni, Pd, Cr, other metals and/or combination thereof. In such an example, the second alloy of the first and/or second cap layers 42, 46 may include any one of Cu, Ag, Au, Co, Pt, Ni, Pd and/or Cr in an amount of about 10 mol % or greater, or about 15 mol % or greater, or about 20 mol % or greater, or about 25 mol % or greater, or about 30 mol % or greater, or about 35 mol % or greater, or about 40 mol % or greater, or about 45 mol % or greater, or about 50 mol % or greater, or about 55 mol % or greater, or about 60 mol % or greater, or about 65 mol % or greater, or about 70 mol % or greater, or about 75 mol % or greater, or about 80 mol % or greater, or about 85 mol % or greater, or about 90 mol % or greater, or about 95 mol % or greater, or about 96 mol % or greater, or about 97 mol % or greater, or about 98 mol % or greater, or about 99 mol % or greater or any and all values and ranges between the given values. Further, the second alloy of the first and/or second cap layers 42, 46 may include any one of Cu, Ag, Au, Co, Pt, Ni, Pd and/or Cr in an amount of about 50 mol % or less, or about 45 mol % or less, or about 40 mol % or less, or about 35 mol % or less, or about 30 mol % or less, or about 25 mol % or less, or about 20 mol % or less, or about 15 mol % or less, or about 10 mol % or less, or about 9 mol % or less, or about 8 mol % or less, or about 7 mol % or less, or about 6 mol % or less, or about 5 mol % or less, or about 4 mol % or less, or about 3 mol % or less, or about 2 mol % or less, or about 1 mol % or less or any and all values and ranges therebetween.

According to various examples, the second alloy of the first and/or second cap layers 42, 46 include a different metal (i.e., the third metal) than the conductive material 38. For example, the first alloy of the conductive material 38 may be substantially formed of In, Sn, Pb, Zn or Sb while the second alloy of the first and/or second cap layer 42, 46 is substantially formed of Cu, Ag, Au, Co, Pt, Ni, Pd and/or Cr.

As explained above, the second alloy of the first and/or second cap layers 42, 46 may exhibit a cap melting temperature. The cap melting temperature of the second alloy of the first and/or second cap layers 42, 46 may be about 150° C., or about 200° C., or about 250° C., or about 300° C., or about 350° C., or about 400° C., or about 450° C., or about 500° C., or about 550° C., or about 600° C., or about 650° C., or about 700° C., or about 750° C., or about 800° C., or about 850° C., or about 900° C., or about 950° C., or about 1000° C., or about 1050° C., or about 1100° C., or about 1150° C., or about 1200° C., or about 1250° C., or about 1300° C., or about 1400° C., or about 1500° C., or about 1600° C., or about 1700° C., or about 1800° C., or any and all values and ranges between the given values. According to various examples, the cap melting temperature of the second alloy of the first and/or second cap layers 42, 46 is greater than the material melting temperature of the conductive material 38. As will be explained in greater detail below, such a feature may be advantageous during processing of the article 10 at temperatures above the material melting temperature of the conductive material 38 and first alloy, but lower than the cap melting temperature of the second alloy of the first and/or second cap layers 42, 46.

Figure 2:
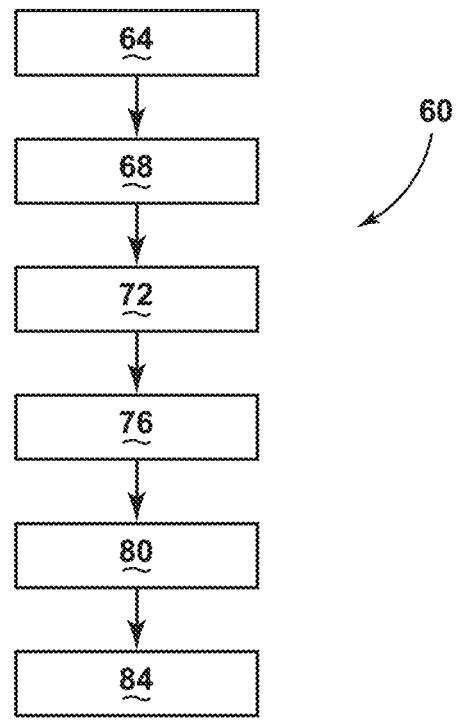
FIG. 2 is a flowchart of a method of making the article, according to at least one example.

Referring now to FIG. 2, a method 60 of forming the article 10 is depicted. The method 60 may begin with a step 64 of forming the via 30 extending from either the first surface 22 or the second surface 26 of the wafer 14 into the body 18 of the wafer 14. As explained above, the via 30 may extend fully through the wafer 14 (i.e., from the first surface 22 to the second surface 26) or may only partially extend into the body 18 of the wafer 14. In examples of the via 30 in which the via 30 only extends partly into the body 18 of the wafer 14, such a via 30 may be referred to as a "blind via." In such a blind via example, the via 30 may only have a single entrance (e.g., either the first entrance 32A or the second entrance 32B). In examples where the via 30 extends from the first surface 22 to the second surface 26, such a via 30 may be referred to as a "through via." The vias 30 may be formed in the body 18 of the wafer 14 in a variety of manners. For example, the vias 30 may be formed by first causing laser damage to the wafer 14 followed by a subsequent etching process. During the laser damage process, a pulsed laser may be used to form one or more damage channels within the body 18 of the wafer 14.

Through the use of the pulsed laser (e.g., in the form of a Bessel beam), it is possible to create microscopic damage channels in the wafer 14 using one or more high energy pulses or one or more bursts of high energy pulses. The damage channels are regions of the material of the wafer 14 which are modified by the laser. The laser-induced modifications disrupt the structure of the wafer 14 material due to the transfer of energy from the laser. Structural disruptions include compaction, melting, dislodging of material, rearrangements, and/or bond scission. The damage channels extend into the interior of the wafer 14 and have a cross-sectional shape consistent with the cross-sectional shape of the laser (e.g., generally circular). In examples where the damage channels have a different shape, the damage channels may be formed through multiple pulses while moving, or translating the wafer 14 and/or laser. Thus, with relative motion between the laser source and the wafer 14, the damage channels can be placed adjacent to one another and in whatever pattern desired.

Additionally or alternatively, the damage channels may be formed in the wafer 14 through laser percussion drilling. Percussion drilling is performed using a laser having a suitable wavelength and intensity, the laser spot size determining the final damage channel size. Wavelengths that may be used range from about 100 nm to about 1070 nm, or in a range of from about 150 nm to about 400 nm. According to some examples, the laser may utilize an ultraviolet laser beam having a wavelength of about 355 nm. In yet other examples, the laser may operate at a higher wavelength such as about 1000 nm or greater, about 2000 nm or greater or about 3000 nm or greater.

The laser is pulsed to repetitively strike the same location on the wafer 14. The laser pulse duration is between about 1 ns and about 100 ns, or more specifically between about 10 ns and about 25 ns. In a specific example, the pulsing of the laser beam may have a pulse width of about 100 ps or less. The laser may be capable of from about 50,000 pulses per second to about 150,000 pulses per second. With each pulse, a portion of the material is removed from the wafer 14 and the damage channel begins to form. As the damage channel is formed in the wafer 14, the damage channel confines the laser beam and creates a long thin hole through the wafer 14. The laser is pulsed until the damage channel is of a desired depth within the wafer 14 and the laser is shut off.

An etchant solution may be applied to the wafer 14 after the laser is utilized to form the damage channels in the wafer 14. Use of the etchant solution may preferentially dissolve or remove material from the damage channels relative to the rest of the wafer 14. Application of the etchant solution to the wafer 14 may widen the damage channels to form the vias 30 in the wafer 14. An exemplary etchant of the wafer 14 may include hydrofluoric acid.

Next, a step 68 of inserting the conductive material 38 within the via 30 is performed. According to various examples, step 68 may include inserting the conductive material 38 within the via 30 and directly contacting conductive material 38 with the via surface 34. It will be understood that prior to insertion of the conductive material 38, glass-containing examples of the wafer 14 can be cleaned by immersion into, or an application of, a mixture of 30 wt. % $NH_4OH$, 30 wt. % $H_2O_2$, and water for 30 minutes followed by immersion into a mixture of 35 wt. % HCl, 30 wt. % $H_2O_2$, and water for 30 min. Following the cleaning, the wafer 14 may be rinsed with deionized water.

The inserting of the conductive material 38 within the via 30 of the wafer 14 may be accomplished in a variety of manners. In a first example, the conductive material 38 may be inserted into the via 30 through ultrasonic soldering. As such, inserting the conductive material 38 within the via 30 may include ultrasonically vibrating at least one of the conductive material 38 and the wafer 14. Ultrasonic soldering is a soldering process that uses ultrasonic energy in conjunction with thermal energy to bond the solder (e.g., the conductive material 38) to a host substrate (e.g., the wafer 14). Ultrasonic soldering may be accomplished in a via 30 by via 30 process, or in a batch process where a plurality of vias 30 are filled simultaneously or substantially simultaneously. In via 30 by via 30 processes, ultrasonic soldering may use an ultrasonic soldering iron which includes a heated soldering iron tip which is coupled to a source of ultrasonic energy. In batch processes, a bath of the conductive material 38 may be coupled to an ultrasonic generator and/or the wafer 14 may be coupled to the ultrasonic generator. Regardless of the method, piezoelectric crystals may be used to generate high-frequency acoustic waves in molten or liquid forms of the conductive material 38 and on the via surface 34. The acoustic energy works via cavitation of the conductive material 38 which mechanically disrupts oxides that form on the surfaces of the molten conductive material 38 as well as the via surface 34. The high-frequency acoustic waves may range from about 10 kHz to about 80 kHz, or from about 20 kHz to about 60 kHz. The vibration and cavitation in the molten conductive material 38 then permits the conductive material 38 to wet and adhere to the via surface 34. In examples where the wafer 14 is composed of a glass, glass-ceramic or ceramic material, the molten conductive material 38 may include active elements such as In, Ti, Hf, Zr and rare earth elements (e.g., Ce, La, and Lu). Inclusion of such "active elements" in the conductive material 38 may be advantageous in directly bonding the oxides of the glass, glass-ceramic or ceramic via surface 34 of the wafer 14 to the conductive material 38. During the ultrasonic soldering process, the molten conductive material 38 may be heated to a temperature of from about 80° C. to about 550° C., or from about 100° C. to about 500° C., or from about 150° C. to about 450° C. or any and all values within the given ranges.

Additionally or alternatively, the conductive material 38 may be injected into the vias 30. In such an example, the molten conductive material 38 may be allowed to flow and/or forced under pressure into one or more of the vias 30. One or both of the first and second surfaces 22, 26 may be covered such that as the molten conductive material 38 is injected, the conductive material 38 largely stays within the via 30 and solidifies. The vias 30 may be filled sequentially or multiple vias 30 may be filled at a time.

According to various examples, the conductive material 38 may fully fill (i.e., flush with the first and/or second surfaces 22, 26) one or more of the vias 30 or conductive material 38 may only partially fill one or more of the vias 30 (i.e., the conductive material 38 may only be present at one of the first and second entrances 32A, 32B). As will be explained in greater detail below, a portion of the conductive material 38 may be exchanged or displaced to form a second alloy in the form of the first and/or second cap layers 42, 46 to seal the vias 30.

As highlighted above, the conductive material 38 is composed of the first alloy which includes the first metal and the second metal. According to various examples, the one or both of the first and second metals are exchangeable, or displaceable, with ions of a third metal. As used herein, the term "ion" encompasses atoms and/or molecules which are capable of changing oxidation states and may be exchanged under galvanic displacement or galvanic exchange. The first metal of the first alloy may include at least one of In and W while the second metal of the first alloy may include at least one of Zn, Sn, Bi, Fe and Mn. According to various examples, the first and/or second metals may have a standard reduction potential ($E_0$) of less than 0 V. As used herein, the standard reduction potential is the measure of the tendency of a chemical species to be reduced as measured with solutes in a solution at an effective concentration of 1 M, gases at a partial pressure of 1 atm, at 25° C. and with metals in a pure state.

The standard reduction potential for the first and/or second metals may be about −0.01 V, or about −0.02 V, or about −0.04 V, or about −0.06 V, or about −0.08 V, or about −0.10 V, or about −0.12 V, or about −0.14 V, or about −0.16 V, or about −0.18 V, or about −0.20 V, or about −0.22 V, or about −0.24 V, or about −0.26 V, or about −0.28 V, or about −0.30 V, or about −0.32 V, or about −0.34 V, or about −0.36 V, or about −0.38 V, or about −0.40 V, or about −0.45 V, or about −0.50 V, or about −0.55 V, or about −0.60 V, or about −0.65 V, or about −0.70 V, or about −0.75 V, or about −0.80 V, or about −0.85 V, or about −0.90 V, or about −0.95 V, or about −1.00 V, or about −1.05 V, or about −1.10 V, or about −1.15 V, or about −1.20 V, or about −1.25 V or any and all values and ranges between the given values. For example, the standard reduction potential for the first and/or second metals may range from about −0.01 V to about −1.25 V, or from about −0.01 V to about −1.10 V, or from about −0.01 V to about −1.00 V, or from about −0.01 V to about −0.90 V, or about −0.01 V to about −0.75 V, or from about −0.01 V to about −0.5 V, or about −0.01 V to about −0.40 V, or about −0.01 V to about −0.30 V, or about −0.01 V to about −0.25 V, or about −0.01 V to about −0.20 V, or about −0.01 V to about −0.15 V, or about −0.01 V to about −0.10 V, or about −0.01 V to about −0.05 V.

Table 1 provides a list of exemplary first and second metals and the associated standard reduction potentials ($E_0$).

TABLE 1

| Metal | $E_0$ (V) |
|---|---|
| $Mn^{2+} + 2e^-$ | −1.18 |
| $Zn^{2+} + 2e^-$ | −0.76 |
| $Fe^{2+} + 2e^-$ | −0.44 |
| $In^{3+} + 3e^-$ | −0.34 |
| $Pb^{2+} + 2e^-$ | −0.13 |
| $Sn^{2+} + 2e^-$ | −0.10 |
| $WO_3(s) + 6H^+ + 6e^-$ | −0.09 |

According to various examples, the standard reduction potential for the first metal may be greater than the standard reduction potential for the second metal. For example, the standard reduction potential of the first metal may be about 0.10 V or greater, or about 0.15 V or greater, or about 0.20 V or greater, or about 0.25 V or greater or about 0.30 V or greater, or about 0.35 V or greater or about 0.40 V or greater than the standard reduction potential of the second metal. It will be understood that any and all values and ranges between the provided values are contemplated. For example, In (e.g., the first metal) has a standard reduction potential 0.42 V greater than Zn (e.g., the second metal). Such a feature may be advantageous in allowing the second metal to preferentially undergo galvanic displacement with the third metal.

During or after step 68 of inserting the conductive material 38 within the via 30, any remaining conductive material 38 which has solidified and cooled on the first and/or second surfaces 22, 26 may be scraped or otherwise removed and recycled. Further, the wafer 14 may be washed with de-ionized water and/or a solvent to clean the wafer 14 in addition to drying (e.g., with $N_2$).

Once step 68 of positioning the conductive material 38 in the via 30 is accomplished, a step 72 of applying a solution including ions of the third metal to the conductive material 38 may be performed. According to various examples, the solution may be applied to only the conductive material 38 while in other examples the solution may be applied to both the surface (e.g., the first and/or second surfaces 22, 26) of the wafer 14 as well as the conductive material 38. For example, the wafer 14, including the conductive material 38, may be submerged within the solution. The solution may be applied to discrete portions of the wafer 14 (e.g., to a subset of the vias 30 including the conductive material 38) and/or the wafer 14 may be partially or fully submerged within the solution such that all of the vias 30 including the conductive material 38 are exposed to the solution.

The solution may include an electrolyte with the ions of the third metal disposed therein. The electrolyte may include water, an acid, other electrolytes and/or combinations thereof. According to various examples, the ions of the third metal may include Cu, Ag, Ni, Au, Pt, Pb, Cd, Cr, Co, Rh, Sn, Zn and/or combinations thereof. The ions of the third metal may be introduced into the electrolyte as sulfates, nitrates, cyanides and/or chlorides. The electrolyte may have a concentration of third metal ions of about 0.0001 M or higher, or about 0.5 M or higher or about 0.8 M or any and all values and ranges therebetween.

According to various examples, the third metal may have a standard reduction potential ($E_0$) of about 0.10 V, or about 0.15 V, or about 0.20 V, or about 0.25 V, or about 0.30 V, or about 0.35 V, or about 0.40 V, or about 0.45 V, or about 0.50 V, or about 0.55 V, or about 0.60 V, or about 0.65 V, or about 0.70 V, or about 0.75 V, or about 0.80 V, or about 0.85 V, or about 0.90 V, or about 0.95 V, or about 1.00 V, or about 1.05 V, or about 1.10 V, or about 1.15 V, or about 1.20 V, or about 1.25 V, or about 1.30 V, or about 1.35 V, or about 1.40 V, or about 1.45 V, or about 1.50 V, or about 1.55 V, or about 1.60 V, or about 1.65 V, or about 1.70 V, or about 1.75 V, or about 1.80 V, or about 1.85 V, or about 1.90 V, or about 1.95 V, or about 2.00 V, or any and all values and ranges between the given values. For example, the standard reduction potential for the third metal may range from about 0.20 V to about 2.0 V, or about 0.20 V to about 1.50 V, or about 0.20 V to about 1.20 V, or about 0.20 V to about 0.9 V, or about 0.20 V to about 0.350 V.

Table 2 provides a list of exemplary third metals and the associated standard reduction potentials.

TABLE 2

| Third Metal | $E_0$ (V) |
|---|---|
| $Ni^{2+} + 2e^-$ | 0.26 |
| $Cu^{2+} + 2e^-$ | 0.34 |
| $Pd^{2+} + 2e^-$ | 0.92 |
| $Pt^{2+} + 2e^-$ | 1.19 |
| $Au^{3+} + 3e^-$ | 1.52 |
| $Ag^{2+} + e^-$ | 1.98 |

The difference in the standard reduction potential of the first and/or second metals and the third metal may be about 0.15 V or greater, or about 0.20 V or greater, or about 0.25 V or greater, or about 0.30 V or greater, or about 0.35 V or greater, or about 0.40 V or greater, or about 0.45 V or greater, or about 0.50 V or greater, or about 0.55 V or greater, or about 0.60 V or greater or any and all values and ranges between the given values. For example, the difference in the standard electrode potential of the first and/or second metals and the third metal may range from about 0.15 V to about 0.60 V, or from about 0.20 V to about 0.50 V, or from about 0.30 V to about 0.50 V, or from about 0.35 V to about 0.45 V.

Once the solution including the ions of the third metal is in contact with the conductive material 38, as outlined in regard to step 72, a step 76 of exchanging a portion of the first and/or second metals with a portion of the ions of the third metal to form a second alloy (i.e., either of the first and/or second cap layers 42, 46) is performed. It will be understood that although described as separate discrete steps for ease and clarity, steps 72 and 76 may be performed substantially simultaneously without departing from the teachings provided herein. According to various examples, the exchange of the ions of the third metal and the first and/or second metal is accomplished through galvanic displacement or galvanic exchange. Galvanic displacement occurs when a metal (e.g., the second metal) that is more reactive (e.g., less noble) comes in contact with a solution containing the ions (e.g., the third metal) of a less reactive (e.g., more noble) metal. The galvanic displacement takes place as long as the cell potential, denoted $E_{cell}$, of resulting reaction is positive. The cell potential is the measure of the potential difference between two half-cell reactions in an electrochemical cell reaction and is calculated using equation 1.

$$E_{cell} = E_{cathode} E_{anode} \qquad \text{(Eq. 1)}$$

It will be understood that the cathode portion of equation 1 represents the standard reduction potential of the third metal and the anode portion of equation 1 represents the standard reduction potential of the first or second metal. A positive $E_{cell}$ value for a given reaction will allow the galvanic displacement reaction to be thermodynamically feasible and to proceed without any external electric field or energy applied thereto. According to various examples, the $E_{cell}$ value may be about 0.3 V or greater to allow the galvanic displacement to proceed.

The cell potential achieved between the solution including the ions of the third metal and the conductive material 38 including the first metal and the second metal may be about 0.10 V, or about 0.15 V, or about 0.20 V, or about 0.25 V, or about 0.30 V, or about 0.35 V, or about 0.40 V, or about 0.45 V, or about 0.50 V, or about 0.55 V, or about 0.60 V, or about 0.65 V, or about 0.70 V, or about 0.75 V, or about 0.80 V, or about 0.85 V, or about 0.90 V, or about 0.95 V, or about 1.00 V, or about 1.05 V, or about 1.10 V, or about 1.15 V, or about 1.20 V, or about 1.25 V, or about 1.30 V, or about 1.35 V, or about 1.40 V, or about 1.45 V, or about 1.50 V, or about 1.55 V, or about 1.60 V, or about 1.65 V, or about 1.70 V, or about 1.75 V, or about 1.80 V, or about 1.85 V, or about 1.90 V, or about 1.95 V, or about 2.00 V, or about 2.50 V or about 3.00 V or any and all values and ranges between the given values.

Provided in equations 2-5 are exemplary galvanic displacement reactions and the associated cell potential ($E_{cell}$) values that may occur through the exchange of the third metal and the first or second metals based on the standard reduction potential values as provided in Tables 1 and 2.

$$Cu^{+2}(solution)+Zn(solid) \rightarrow Zn^{+2}(solution)+Cu(solid)=1.10\ V \quad (Eq.\ 2)$$

$$3Cu^{+2}(solution)+2\ In(solid) \rightarrow 2In^{+3}(solution)+3Cu(solid)=0.66\ V \quad (Eq.\ 3)$$

$$Cu^{+2}(solution)+Sn(solid) \rightarrow Sn^{+2}(solution)+Cu(solid)=0.46\ V \quad (Eq.\ 4)$$

$$Cu^{+2}(solution)+Pb(solid) \rightarrow Pb^{+2}(solution)+Cu(solid)=0.44\ V \quad (Eq.\ 5)$$

As explained above, in examples where the reaction of the first and/or second metals and the ions of the third metal results in a cell potential $E_{cell}$ of about 0.3 V, the galvanic displacement may occur spontaneously and without any additional electrical energy. As such, the galvanic displacement may be performed free of external electrical potential applied to the solution or to the conductive material 38.

Once the solution is in contact with the conductive material 38, a portion of the ions of the third metal may be exchanged with the conductive material (i.e., one or more of the first and second metals) to form the second alloy as the first and/or second cap layers 42, 46 thereby sealing the via 30 proximate the first and/or second surfaces 22, 26. In other words, the second alloy may seal the via 30 proximate one or more of the first and second via entrances 32A, 32B. As explained above, the formation of the second alloy of the first and/or second cap layers 42, 46, through the galvanic displacement between the first and/or second metal and the third metal, may result in the first and/or second cap layers 42, 46 being integrally formed with the conductive material 38 and have close adhesion to the via surface 34 of the via 30.

Depending on the construction of the article 10, solutions having different compositions (i.e., different third metal ions or different quantities of third metal ions) may be applied to different conductive materials 38 in different vias 30. Such a feature may be advantageous in creating different composition second alloys (i.e., first and/or second cap layers 42, 46) across one or both of the surfaces (i.e., the first and/or second surfaces 22, 26). Further, the solution applied to the first surface 22 may be different than a solution applied to the second surface 26 such that the second alloy of the first cap layers 42 have a different composition, depth, or other property than the second alloy of the second cap layers 46.

Once the second alloy of the first and/or second cap layers 42, 46 is formed on the conductive material 38 and seals the vias 30, a step 80 of heating the wafer 14 including the conductive material 38 and the second alloy of the first and/or second cap layers 42, 46 to a temperature above a melting temperature of the conductive material 38 may be performed. The temperature may be about 100° C., or about 200° C., or about 300° C., or about 400° C., or about 500° C., or about 600° C., or about 700° C., or about 800° C., or about 900° C., or about 1000° C. or any and all values and ranges between the given values. Depending on the use of the final article 10, one or more processes (e.g., heat treating, thermal processing, circuitization, etc.) which expose the article 10 to elevated temperatures may be performed. Often, such processes may be above the melting temperature of the conductive material 38. In conventional designs, such later thermal processing may damage metallized vias resulting in melting, draining or delamination of the metallized via to a substrate. Use of the present disclosure, which utilizes materials in the second alloy of the first and/or second cap layers 42, 46 which has a higher melting temperature than the conductive material 38, may be advantageous in allowing later thermal processing, which may tend to melt the conductive material 38, while utilizing the second alloy of the first and/or second cap layers 42, 46 to retain the conductive material 38 within the vias 30. In other words, the first and/or second cap layers 42, 46 having the second alloy may prevent leaking of the conductive material 38 from the vias 30 during later thermal processing steps.

According to some examples, the method 60 may include an additional step 84 of increasing a thickness of the first and/or second cap layers 42, 46. Increasing the thickness of the first and/or second cap layers 42, 46 may be accomplished in a variety of manners.

In a first example, the thickness of the first and/or second cap layers 42, 46 may be increased through electroplating on one of the first and/or second cap layers 42, 46. Once the first and/or second cap layers 42, 46 are formed, an electrolyte containing ions of the metal to be deposited on the first and/or second cap layers 42, 46 is placed in contact with the first and/or second cap layers 42, 46 followed by an electrochemical reduction of the ions to metal particles on the first and/or second cap layers 42, 46 by applied current and/or voltage. Electrochemical deposition is continued until the first and/or second cap layers 42, 46 reach the desired thickness. The metal ions may include Cu, Ag, Ni, Au, Pt, Pb, Cd, Cr, Rh, Sn, Zn and/or combinations thereof. The metal ions may be introduced into the electrolyte as sulfates, nitrates, cyanides and/or chlorides. The electrolyte may have a concentration of ions of about 0.0001 M or higher. Current, voltage or a combination thereof is applied between the electrolyte and the conductive material 38 to provide a negative constant current to the first and/or second cap layers 42, 46. A current density between the first and/or second cap layers 42, 46 and the electrolyte may range from about 0.001 mA/cm$^2$ to about 1 A/cm$^2$ and a voltage range of about –0.001 V to about –20 V may be provided. As the current or voltage is applied between the first and/or second cap layers 42, 46 and the electrolyte, the metal ions begin to plate and thicken first and/or second cap layers 42, 46. At the interface between the electrolyte and the first and/or second cap layers 42, 46 electrons are transferred to the metal ions to reduce them to first and/or second cap layers 42, 46, as shown in equation 6 below. It will be understood that although equation 6 is shown utilizing Cu, other plateable metals may be utilized without departing from the teachings provided herein.

$$Cu_{electrolyte}^{2+} + 2e^- \rightarrow Cu_{cap\ layer} \quad \text{(Eq. 6)}$$

In a second example, step 84 of increasing the thickness of the first and/or second cap layers 42, 46 may be accomplished through physical vapor deposition. In such an example, the wafer 14 including the conductive material 38 and the first and/or second cap layers 42, 46 may be placed on a substrate stage within a vacuum chamber. A mask may optionally be employed to direct deposition onto only the first and/or second cap layers 42, 46 or the mask may be omitted and the entire surface (e.g., the first and/or second surfaces 22, 26) may be deposited on. The vacuum chamber may be evacuated (e.g., to a pressure of about $10^{-3}$ Torr). After the vacuum chamber is evacuated, Cu, Ag, Ni, Au, Pt, Pb, Cd, Cr, Rh, Sn, Zn and/or combinations thereof may deposited. The deposition may occur via cathodic arc deposition, electron beam physical vapor deposition, evaporative deposition, pulsed laser deposition, sputter deposition, pulsed electron deposition and/or through sublimation. Deposition may occur until the first and/or second cap layers 42, 46 have reached the desired thickness.

It will be understood that step 84 may be accomplished using the same composition as the second alloy of the first and/or second cap layer 42, 46 or it may be different. For example, composition the first and/or second cap layers 42, 46 may be constant throughout the thickness (i.e., the second alloy) or step 84 may deposit material with a different composition than the second alloy.

Use of the present disclosure may offer a variety of advantages. First, the disclosed method 60 may be scalable. Conventional production of metallized vias often suffers from highly intensive production techniques which are difficult to scale and as such may require specialized equipment and long processing times. As the present disclosure may utilize ultrasonic dip coating and offers the ability to process multiple wafers 14 simultaneously, decreased production times and associated costs may be reduced. Further, as wafers 14 including vias 30 of different dimensions can be processed simultaneously, additional reduction in production times and associated costs may be achieved.

Second, use of conductive material 38 having the compositions outlined herein offers the ability to generate high adhesion between the via surface 34 and conductive material 38. Conventional metallized vias often rely on the use of adhesion layers to facilitate bonding between the metallized via and the surrounding substrate. The adhesion layers are often necessary due to differences in bonding type between metallized via (e.g., metallic) and the bonding type of the substrate (e.g., covalent). Use of the presently disclosed conductive material 38 provides the ability to chemically bond the conductive material 38 with the via surface 34 while also eliminating the time-consuming and costly process of depositing adhesion layers. Further, the compositions of the conductive material 38 outlined herein offer a low melting point which may be advantageous in easily completely filling the vias 30.

Third, use of the conductive material 38 having the compositions outlined herein offers the ability to form conductive material 38 filled vias 30 which will result in lower stress and prevent cracking of the wafer 14. As In containing alloys have greater ductility as compared to conventional Cu based metallized vias, stresses on the wafer 14 as a result of thermal loading are less likely to result in damage to the wafer 14.

Fourth, use of the first and/or second cap layers 42, 46 to cap the conductive material 38 may allow for thermal processing of the wafer 14 after placement of the conductive material 38. Often, thermal processing is required of substrates after the production of metallized vias which places a constraint on the material that may be used for the metallized via. Use of the presently disclosed second alloy of the first and/or second cap layers 42, 46 allows for the wafer 14 to reach temperatures above the melting temperature of the conductive material 38 without risking the conductive material 38 draining or flowing out of the via 30.

Fifth, as the galvanic displacement of the ions of the third metal and the first and/or second metals is capable of spontaneous reaction without the application of external electrical energy, the presently disclosed method 60 may offer time and costs savings in manufacturing. Further, as forming of the first and/or second cap layers 42, 46 may spontaneously occur, additional equipment and time associated with applying an electrical potential to the solution and the conductive material 38 may be eliminated.

Sixth, using the presently disclosed processes may allow for the wafer 14 to be composed of a broad material set, with a wide range of properties driven by composition. For example, controlling compositional changes allows tailoring of various properties of the article 10 such as mechanical, thermal, electrical, optical, and even chemical durability characteristics. Compared to traditional articles 10 which include a substrate formed of silicon, glass examples of the wafer 14 of the present disclosure offer the ability to alter the coefficient of thermal expansion (CTE) thereby making glass a promising material for different applications where stack warpage due to CTE mismatch presents a significant reliability concern.

Seventh, the present disclosure has a wide range of applications in consumer electronics, high-performance processors, microelectromechanical devices (MEMS), touch sensors, biomedical devices, high-capacity memories, automotive electronics and aerospace components.

EXAMPLES

Provided below are examples consistent with the present disclosure.

Figure 3A:
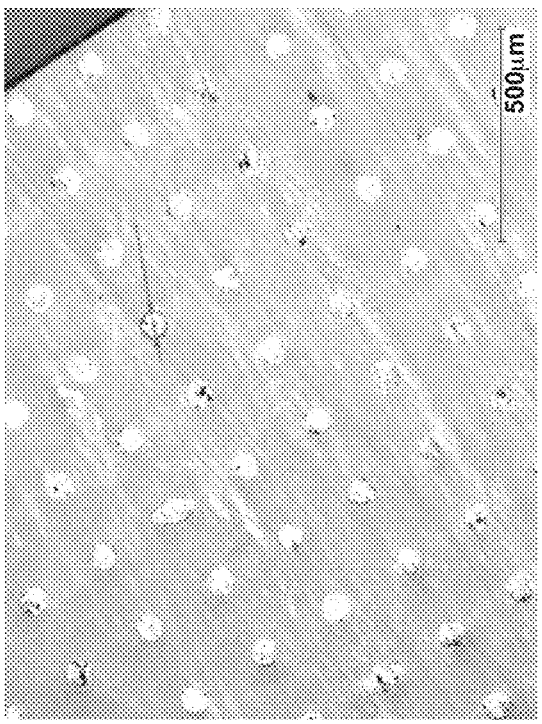
FIG. 3A is a top view of a wafer having a plurality of solder filled holes in a substrate.
Figure 3B:
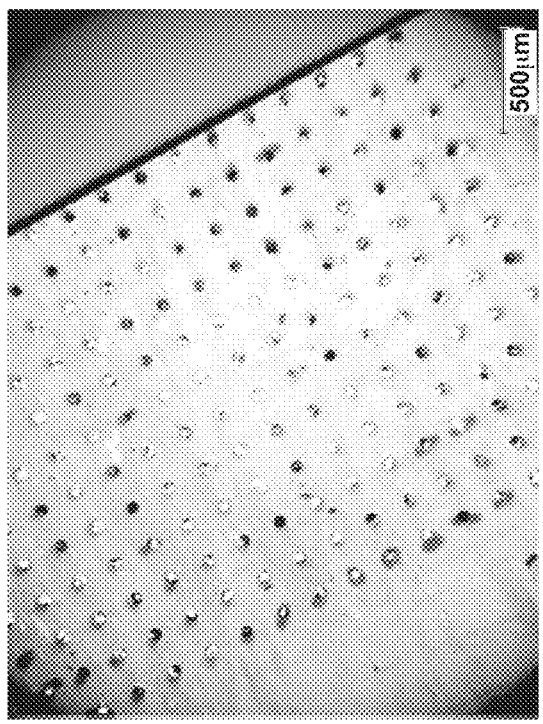
FIG. 3B is a bottom view of the wafer of FIG. 3A.
Figure 3C:
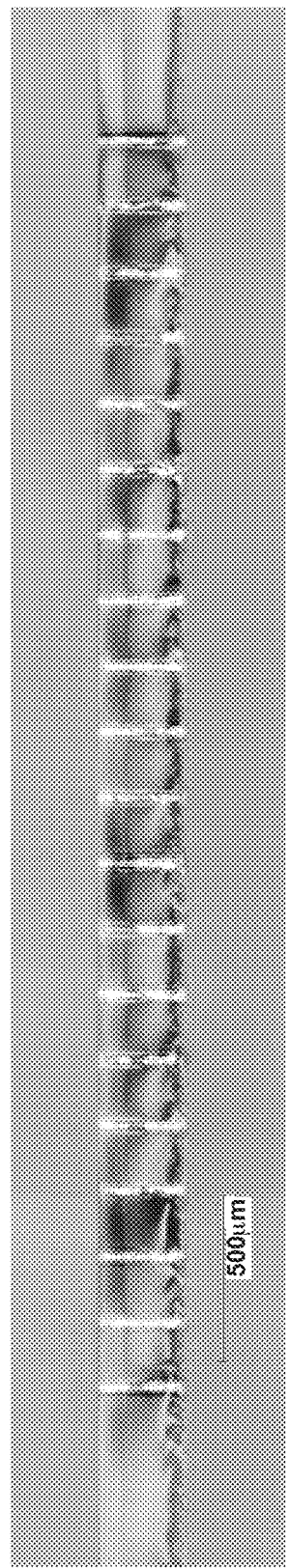
FIG. 3C is a cross-sectional view of the wafer of FIG. 3A showing the plurality of holes having an hourglass profile.
Figure 3D:
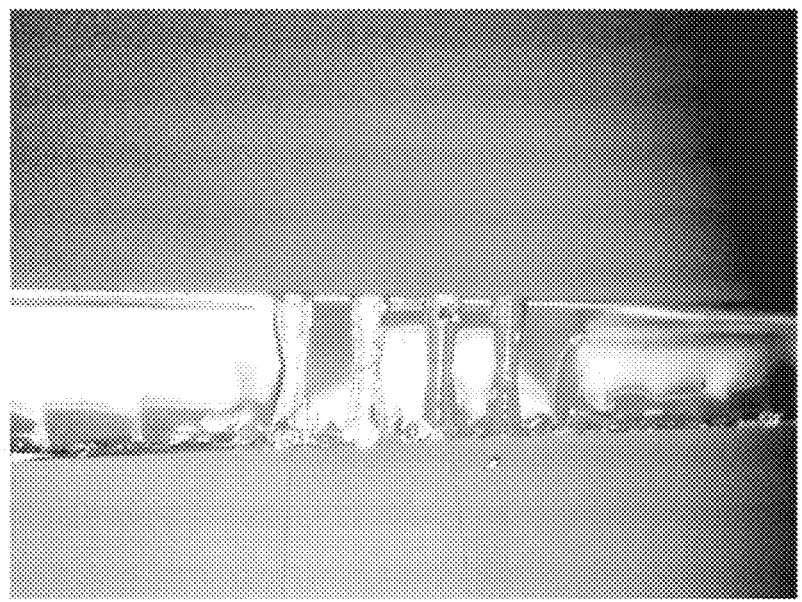
FIG. 3D is a cross-sectional view of filled and unfilled holes in a substrate.

Referring now to FIGS. 3A-3D and 4, provided are images of an indium alloy (e.g., the first alloy of the conductive material 38) positioned within a hole (e.g., the via 30) of a substrate (e.g., the wafer 14). The indium alloy was an indium-based solder sold under the name Cerasolzer Indium alloy. The indium alloy included zinc. The indium alloy was applied to the holes using an ultrasonic soldering iron (e.g., step 68). The holes of FIGS. 3A-3D had holes with an hourglass-shaped profile. As can be seen, the indium alloy showed complete filling of the hole despite the hourglass profile. The holes had an 80 μm surface diameter and the substrate was 300 μm thick. The top two holes of FIG. 3D are not filled with the indium alloy and the bottom two holes are filled with the indium alloy. The holes of FIG. 4 were tapered with a 20 μm diameter at one end and a 12 μm to 15 μm diameter on the other end of the hole. The thickness of the substrate was around 100 μm. As can be seen, both the tapered and hour-glass-shaped holes were completely filled by the indium alloy using the ultrasonic solder.

Figure 4:
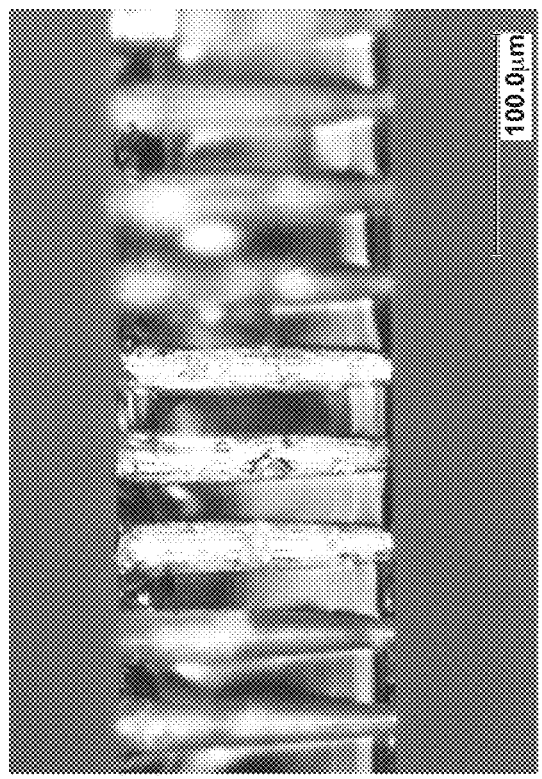
FIG. 4 is a cross-sectional view of tapered holes formed in a wafer filled with an indium solder.
Figure 5B:
FIG. 5B is a bottom image of indium solder filled holes capped with copper.
Figure 5A:
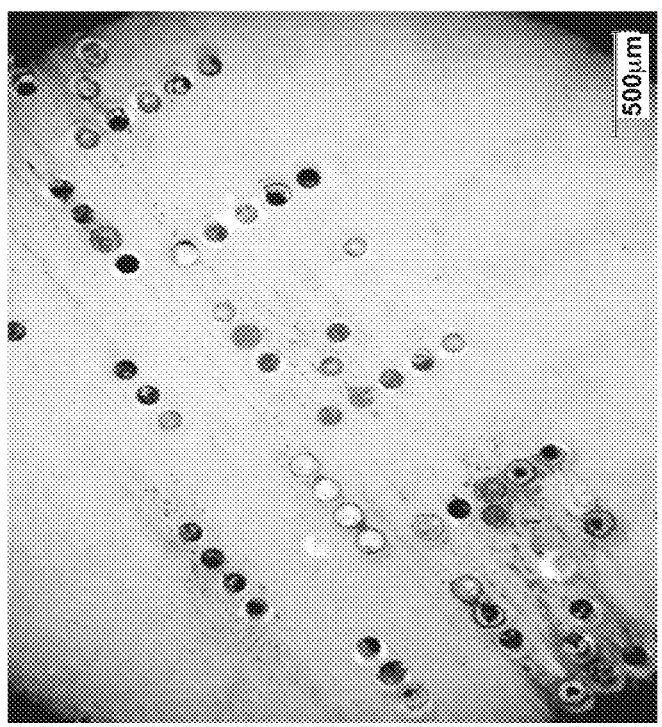
FIG. 5A is a top image of indium solder filled holes capped with copper.

Referring now to FIGS. 5A and 5B, depicted are indium alloy filled holes in a substrate produced substantially similar that described in connection with FIGS. 3A-4. The substrate of FIGS. 5A and 5B includes copper caps (e.g., the second alloy of the first and second layers 42, 46) on the indium alloy filled holes. The copper caps were formed by dipping the substrate, including the indium alloy filled holes, into a copper sulfate mixture (e.g., the solution containing ions of the third metal). The copper sulfate mixture had a concentration of 0.5 M to 0.8 M copper sulfate with 0.75 M sulfuric acid. It was observed that when the zinc present in the indium alloy was dipped in copper sulfate solution (e.g., step 68), the copper caps began to form on the indium alloy through galvanic displacement (e.g., 72). The reason for the formation of the copper caps is that the various components (e.g., zinc, indium, etc.) in the indium alloy is oxidized and enters the mixture while the copper ions of the mixture are reduced and displace into and on the indium alloy (e.g., forming the second alloy). In other words, the components (e.g., the first and second metal) of the indium alloy are galvanically displaced with the copper (e.g., the ions of the third metal) of the mixture.

Figure 6B:
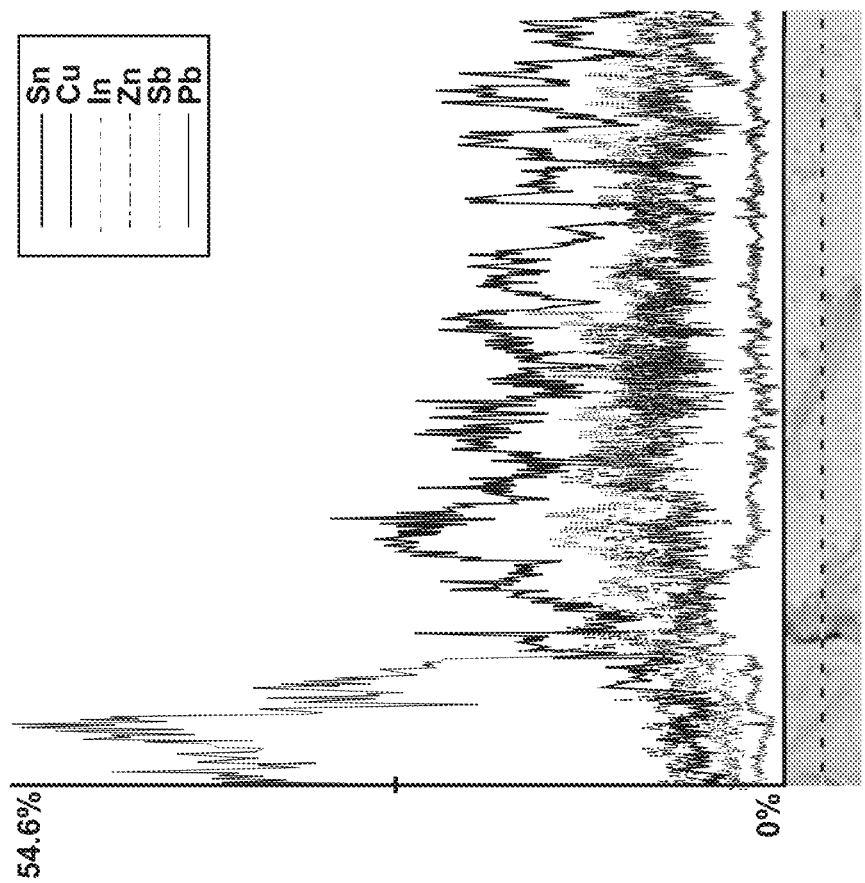
FIG. 6B is an energy-dispersive X-ray spectroscopy (EDS) line scan of the solder wire of FIG. 6A showing the atomic % of various elements vs. position.
Figure 6A:
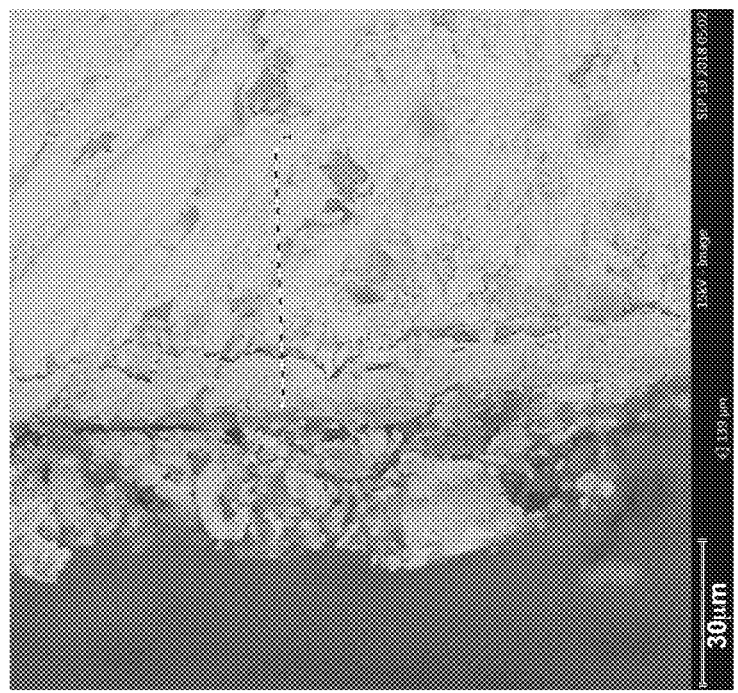
FIG. 6A is a micrograph of a solder wire which was dipped in a copper sulfate solution.

Referring now to FIGS. 6A and 6B, provided is a micrograph (FIG. 6A) and an energy-dispersive X-ray spectroscopy (EDS) line scan (FIG. 6B) of a Cerasolzer indium alloy solder wire dipped in a copper sulfate mixture having a concentration of 0.5 M to 0.8 M copper sulfate with 0.75 M sulfuric acid. As can be seen from the EDS line scan, the presence of Sn, In, and Sb are all dramatically reduced in the presence of the copper indicating that a galvanic displacement between the Sn, In, Sb and the Cu has taken place. The galvanic displacement has formed a copper coating on the solder wire having a thickness of about 10 µm as measured from the outer edge of the copper coating to the point where the copper concentration reaches the concentration of the copper in the solder wire.

Clause 1 of the present disclosure extends to:
A method of forming an article, comprising:
inserting a conductive material within a via of a wafer, wherein the conductive material comprises a first alloy, the first alloy comprising a first metal and a second metal; and contacting the conductive material with a solution comprising ions of a third metal, wherein the ions of the third metal galvanically displace a portion of the second metal from the first alloy to form a second alloy with the first metal.

Clause 2 of the present disclosure extends to:
The method of clause 1, wherein the wafer comprises a glass, a glass-ceramic, a ceramic or silicon.

Clause 3 of the present disclosure extends to:
The method of any of clauses 1 and 2, wherein the first metal comprises at least one of In and W.

Clause 4 of the present disclosure extends to:
The method of any of clauses 1-3, wherein the second metal comprises at least one of Zn, Sn, Bi, Pb, Fe and Mn.

Clause 5 of the present disclosure extends to:
The method of any of clauses 1-4, wherein the third metal comprises at least one of Cu, Ag, Au, Co, Pt, Ni, Pd and Cr.

Clause 6 of the present disclosure extends to:
The method of any of clauses 1-5, wherein the first metal is chemically bonded to the wafer.

Clause 7 of the present disclosure extends to:
The method of any of clauses 1-6, wherein a standard reduction potential of the first metal is at least 0.05 V greater than a standard reduction potential of the second metal.

Clause 8 of the present disclosure extends to:
The method of any of clauses 1-7, wherein a standard reduction potential of the first metal is at least 0.10 V greater than a standard reduction potential of the second metal.

Clause 9 of the present disclosure extends to:
The method of any of clauses 1-8, wherein a standard reduction potential of the third metal is at least 0.15 V greater than a standard reduction potential of the second metal.

Clause 10 of the present disclosure extends to:
The method of any of clauses 1-9, wherein a standard reduction potential of the third metal is at least 0.50 V greater than a standard reduction potential of the second metal.

Clause 11 of the present disclosure extends to:
The method of any of clauses 1-10, wherein the second alloy forms a cap layer in the via extending from an entrance of the via to a depth of about 20 µm or less.

Clause 12 of the present disclosure extends to:
The method of any of clauses 1-10, wherein the second alloy forms a cap layer in the via extending from an entrance of the via to a depth of about 10 µm or less.

Clause 13 of the present disclosure extends to:
The method of any of clauses 1-12, wherein the second alloy has a higher melting temperature than the first alloy.

Clause 14 of the present disclosure extends to:
A method of forming an article, comprising:
inserting an electrically conductive material within a via of a wafer, wherein the electrically conductive material comprises a first alloy, the first alloy comprising a first metal and a second metal;
applying a solution comprising ions of a third metal to the conductive material; and galvanically exchanging a portion of the first alloy with a portion of the ions of the third metal to form a cap layer comprising a second alloy in contact with the conductive material, wherein the standard reduction potential of the third metal is at least 0.15 V greater than the standard reduction potential of the second metal.

Clause 15 of the present disclosure extends to:
The method of clause 14, wherein the cap layer seals an entrance of the via.

Clause 16 of the present disclosure extends to:
The method of any of clauses 14 and 15, wherein a melting temperature of the electrically conductive material is from about 100° C. to about 300° C.

Clause 17 of the present disclosure extends to:
The method of any of clauses 14-16, wherein inserting the electrically conductive material comprises positioning the electrically conductive material in direct contact with a via surface over a majority of the via.

Clause 18 of the present disclosure extends to:
The method of any of clauses 14-17, wherein positioning the electrically conductive material within the via comprises ultrasonically vibrating at least one of the electrically conductive material and the wafer.

Clause 19 of the present disclosure extends to:
The method of any of clauses 14-18, wherein inserting the electrically conductive material comprises inserting the electrically conductive material within the via such that the electrically conductive material fills about 95% or greater of a volume of the via.

Clause 20 of the present disclosure extends to:
A method of forming an article, comprising:
forming a via extending from a surface of a glass wafer into a body of the glass wafer;

inserting an electrically conductive material comprising In and a second metal within the via;

applying a solution comprising ions of a third metal to the surface of the wafer and the electrically conductive material; and galvanically exchanging a portion of the ions of the third metal with a portion of the electrically conductive material to form a cap layer in contact with the electrically conductive material which seals the via proximate the surface of the wafer, wherein a cell potential of the exchange between a portion of the electrically conductive material and the third metal is about 0.3 V or greater.

Clause 21 of the present disclosure extends to:
The method of clause 20, further comprising:
heating the wafer comprising the electrically conductive material and the cap layer to a temperature above a melting temperature of the electrically conductive material.

Clause 22 of the present disclosure extends to:
The method of any of clauses 20 and 21, further comprising:
increasing a thickness of the cap layer.

Clause 23 of the present disclosure extends to:
The method of clause 22, wherein increasing the thickness of the cap layer comprises electroplating on the cap layer to increase the thickness of the cap layer.

Clause 24 of the present disclosure extends to:
The method of clause 22, wherein increasing the thickness of the cap layer comprises physical vapor deposition on the cap layer to increase the thickness of the cap layer.

Modifications of the disclosure will occur to those skilled in the art and to those who make or use the disclosure. Therefore, it is understood that the embodiments shown in the drawings and described above are merely for illustrative purposes and not intended to limit the scope of the disclosure, which is defined by the following claims, as interpreted according to the principles of patent law, including the doctrine of equivalents.

It is also important to note that the construction and arrangement of the elements of the disclosure, as shown in the exemplary embodiments, is illustrative only. Although only a few embodiments of the present innovations have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts, or elements shown as multiple parts may be integrally formed, the operation of the interfaces may be reversed or otherwise varied, the length or width of the structures, and/or members, or connectors, or other elements of the system, may be varied, and the nature or number of adjustment positions provided between the elements may be varied. It should be noted that the elements and/or assemblies of the system may be constructed from any of a wide variety of materials that provide sufficient strength or durability, in any of a wide variety of colors, textures, and combinations. Accordingly, all such modifications are intended to be included within the scope of the present innovations. Other substitutions, modifications, changes, and omissions may be made in the design, operating conditions, and arrangement of the desired and other exemplary embodiments without departing from the spirit of the present innovations.

What is claimed is:

1. A method of forming an article, comprising:
    inserting a conductive material within a via of a wafer, wherein the conductive material comprises a first alloy, the first alloy comprising a first metal and a second metal; and
    contacting the conductive material with a solution comprising ions of a third metal, wherein the ions of the third metal galvanically displace a portion of the second metal from the first alloy to form a second alloy with the first metal.

2. The method of claim 1, wherein the wafer comprises a glass, a glass-ceramic, a ceramic or silicon.

3. The method of claim 1, wherein the first metal comprises at least one of In and W.

4. The method of claim 1, wherein the second metal comprises at least one of Zn, Sn, Bi, Pb, Fe and Mn.

5. The method of claim 1, wherein the third metal comprises at least one of Cu, Ag, Au, Co, Pt, Ni, Pd and Cr.

6. The method of claim 1, wherein the first metal is chemically bonded to the wafer.

7. The method of claim 1, wherein a standard reduction potential of the first metal is at least 0.05 V greater than a standard reduction potential of the second metal.

8. The method of claim 1, wherein a standard reduction potential of the third metal is at least 0.50 V greater than a standard reduction potential of the second metal.

9. The method of claim 1, wherein the second alloy forms a cap layer in the via extending from an entrance of the via to a depth of about 20 µm or less.

10. The method of claim 1, wherein the second alloy has a higher melting temperature than the first alloy.

11. A method of forming an article, comprising:
    inserting an electrically conductive material within a via of a wafer, wherein the electrically conductive material comprises a first alloy, the first alloy comprising a first metal and a second metal;
    applying a solution comprising ions of a third metal to the conductive material; and
    galvanically exchanging a portion of the first alloy with a portion of the ions of the third metal to form a cap layer comprising a second alloy in contact with the conductive material, wherein the standard reduction potential of the third metal is at least 0.15 V greater than the standard reduction potential of the second metal.

12. The method of claim 11, wherein the cap layer seals an entrance of the via.

13. The method of claim 11, wherein a melting temperature of the electrically conductive material is from about 100° C. to about 300° C.

14. The method of claim 11, wherein positioning the electrically conductive material within the via comprises ultrasonically vibrating at least one of the electrically conductive material and the wafer.

15. The method of claim 11, wherein inserting the electrically conductive material comprises inserting the electrically conductive material within the via such that the electrically conductive material fills about 95% or greater of a volume of the via.

16. A method of forming an article, comprising:
    forming a via extending from a surface of a glass wafer into a body of the glass wafer;
    inserting an electrically conductive material comprising In and a second metal within the via;
    applying a solution comprising ions of a third metal to the surface of the wafer and the electrically conductive material; and galvanically exchanging a portion of the ions of the third metal with a portion of the electrically conductive material to form a cap layer in contact with the electrically conductive material which seals the via proximate the surface of the wafer, wherein a cell potential of the exchange between a portion of the electrically conductive material and the third metal is about 0.3 V or greater.

17. The method of claim 16, further comprising:
heating the wafer comprising the electrically conductive material and the cap layer to a temperature above a melting temperature of the electrically conductive material.

18. The method of claim 16, further comprising:
increasing a thickness of the cap layer.

19. The method of claim 18, wherein increasing the thickness of the cap layer comprises electroplating on the cap layer to increase the thickness of the cap layer.

20. The method of claim 18, wherein increasing the thickness of the cap layer comprises physical vapor deposition on the cap layer to increase the thickness of the cap layer.

\* \* \* \* \*